(12) United States Patent
Banin et al.

(10) Patent No.: US 9,019,021 B2
(45) Date of Patent: Apr. 28, 2015

(54) MULTI-PHASE VOLTAGE-CONTROLLED OSCILLATOR

(75) Inventors: Rotem Banin, Zur Moshe (IL); Ofir Degani, Haifa (IL); Eran Socher, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/996,518

(22) PCT Filed: Dec. 19, 2011

(86) PCT No.: PCT/US2011/065790
§ 371 (c)(1),
(2), (4) Date: Jun. 20, 2014

(87) PCT Pub. No.: WO2013/095327
PCT Pub. Date: Jun. 27, 2013

(65) Prior Publication Data
US 2014/0306772 A1 Oct. 16, 2014

(51) Int. Cl.
H03K 3/03 (2006.01)
H03B 27/00 (2006.01)
H03B 5/18 (2006.01)

(52) U.S. Cl.
CPC .............. H03B 27/00 (2013.01); H03K 3/0315 (2013.01); H03B 5/1852 (2013.01)

(58) Field of Classification Search
USPC .............................. 331/2, 46, 57, 45; 327/156
See application file for complete search history.

(56) References Cited

U.S. PATENT DOCUMENTS

| 5,592,126 A | 1/1997 | Boudewijns et al. |
| 5,635,880 A | 6/1997 | Brown |
| 8,791,765 B2 * | 7/2014 | Emira et al. ............. 331/96 |
| 2011/0007615 A1 | 1/2011 | Fujiwara et al. |

FOREIGN PATENT DOCUMENTS

WO WO2004-017518 A2 2/2004

OTHER PUBLICATIONS

International Preliminary Report on Patentability mailed Jul. 3, 2014 from International Application No. PCT/US2011/065790.
International Search Report and Written Opinion mailed Sep. 25, 2012 from International Application No. PCT/US2011/065790.

* cited by examiner

*Primary Examiner* — Arnold Kinkead
(74) *Attorney, Agent, or Firm* — Schwabe, Williamson & Wyatt, P.C.

(57) ABSTRACT

Embodiments provide a multi-phase voltage controlled oscillator (VCO) that produces a plurality of output signals having a common frequency and different phases. In one embodiment, the VCO may include a passive conductive structure having a first ring and a plurality of taps spaced around the first ring. The VCO may further include a capacitive load coupled to the passive conductive structure, one or more feedback structures coupled between a pair of opposing taps of the plurality of taps, and one or more current injection devices coupled between a pair of adjacent taps of the plurality of taps.

24 Claims, 3 Drawing Sheets

MULTI-PHASE VOLTAGE-CONTROLLED OSCILLATOR

CROSS REFERENCE TO RELATED APPLICATIONS

The present application is a national phase entry under 35 U.S.C. §371 of International Application No. PCT/US2011/065790, filed Dec. 19, 2011, entitled "MULTI-PHASE VOLTAGE-CONTROLLED OSCILLATOR", which designates the United States of America. The entire content and disclosure of which is hereby incorporated by reference in its entirety.

TECHNICAL FIELD

Embodiments of the present disclosure relate generally to electronic circuits, and more particularly, to voltage-controlled oscillators.

BACKGROUND

Many communications systems rely on multi-phase frequency generation. For example, some modulation schemes, such as quadrature modulation (e.g., I/Q modulation and/or quadrature amplitude modulation (QAM)), phase modulation, and/or phase-shift keying (PSK) may use multiple phases to transmit data signals. Additionally, some systems (e.g., peripheral component interconnect express (PCIe)) may use multiple phases to achieve signal shaping and/or to multiply the frequency.

Several circuit architectures exist for producing multiple phases, including passive and active phase shifters, frequency dividers, delay locked loops (DLLs), and voltage-controlled oscillators (VCOs). However, these circuits include several lumped circuits or a single distributed circuit to produce the multiple phases. Furthermore, the DLL circuits have high phase noise and do not operate at a wide bandwidth.

BRIEF DESCRIPTION OF THE DRAWINGS

Embodiments of the present disclosure will be described by way of exemplary embodiments, but not limitations, illustrated in the accompanying drawings in which like references denote similar elements, and in which.

DETAILED DESCRIPTION

Figure 1:
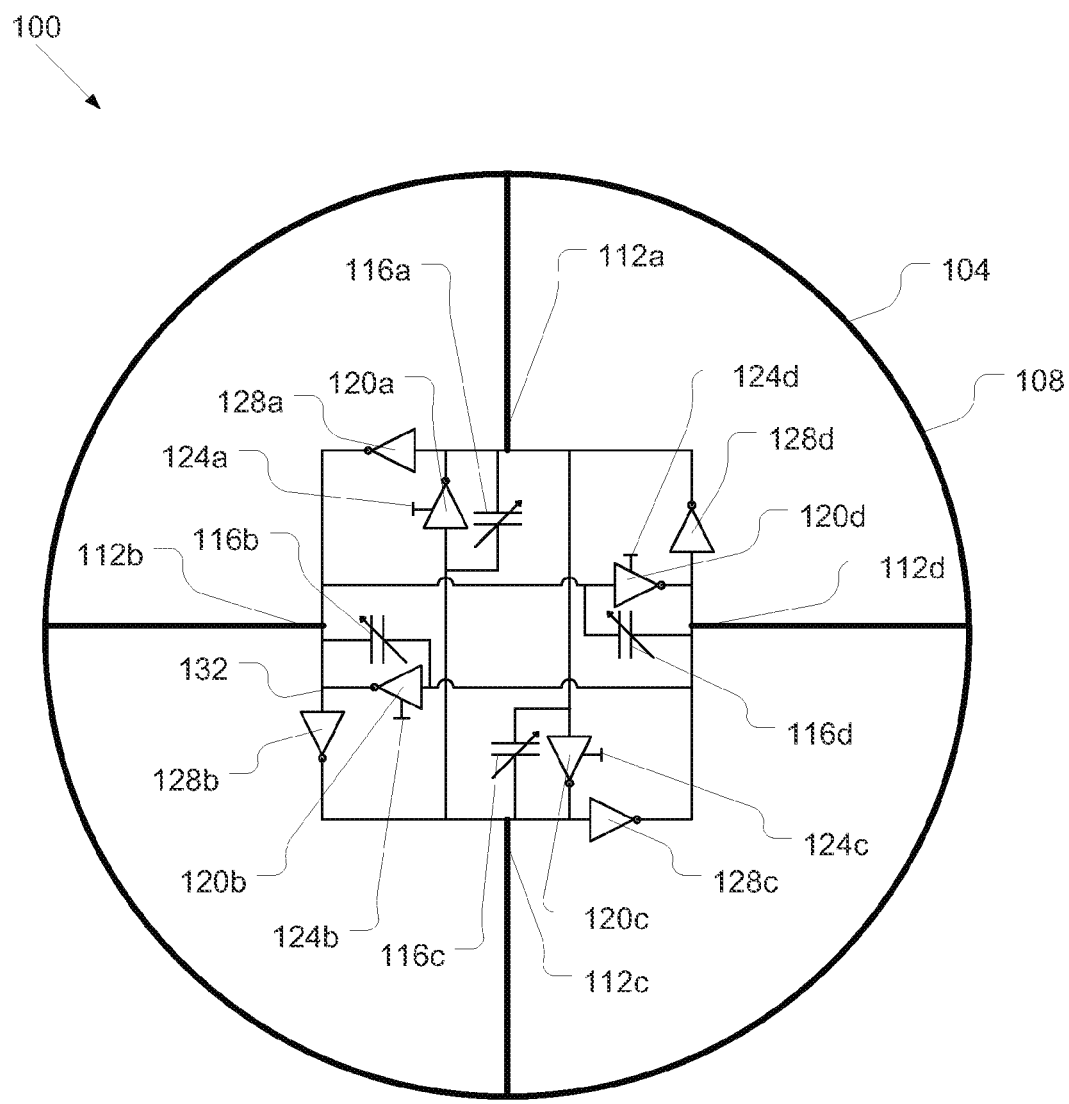
FIG. 1 is a circuit diagram of a multi-phase voltage-controlled oscillator (VCO) having four taps in accordance with various embodiments.

Illustrative embodiments of the present disclosure include, but are not limited to apparatuses, systems, and methods for multi-phase voltage-controlled oscillators.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B and C" means (A), (B), (C), (A and B), (A and C), (B and C) or (A, B and C). The phrase "(A) B" means (B) or (A and B), that is, A is optional.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the present disclosure. This application is intended to cover any adaptations or variations of the embodiments discussed herein. Therefore, it is manifestly intended that the embodiments of the present disclosure be limited only by the claims and the equivalents thereof.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Various embodiments provide a multi-phase voltage-controlled oscillator (VCO). In one embodiment, the VCO may include a passive conductive structure having a first ring and a plurality of taps spaced around the first ring. The VCO may further include a capacitive load coupled to the passive conductive structure. The VCO may also include a plurality of feedback structures. One or more feedback structures of the plurality of feedback structures may be coupled between a pair of opposing taps of the plurality of taps. The feedback structures may be configured to provide positive feedback between the pair of opposing taps with gain so that output signals at the pair of opposing taps oscillate with a predetermined phase-relationship with respect to one another. The VCO may further include a plurality of current injection devices coupled together in a second ring. A first current injection device of the plurality of current injection devices may be coupled between a pair of adjacent taps of the plurality of taps and configured to provide output signals at the pair of adjacent taps with a common frequency. In some embodiments, the predetermined phase-relationship may be 180 degrees. Furthermore, in some embodiments, the first current injection device may be configured to provide the output signals at the pair of adjacent taps with different phases.

The VCO may produce output signals at the plurality of taps having a common frequency and different phases. In some embodiments, the phases of the output signals may be evenly spaced from one another.

FIG. 1 illustrates a VCO 100 in accordance with various embodiments. VCO 100 may include a passive conductive structure 104 having a first ring 108 and a plurality of taps 112a-d spaced around the first ring 108. In some embodiments, the plurality of taps 112a-d may be evenly spaced around the first ring 108, as shown in FIG. 1. In some embodiments the passive conductive structure 104 may be composed of a metal. The term "passive" as used herein may refer to a structure that does not include active devices, such as transistors. The VCO 100 may produce output signals at the plurality of taps 112a-d (e.g., a first output signal at tap 112a, a second output signal at tap 112b, a third output signal at tap 112c, and a fourth output signal at tap 112d).

In various embodiments, VCO 100 may further include a capacitive load 116 coupled to the passive conductive structure 104. The capacitive load 116 may include one or more capacitive elements 116a-d. In some embodiments, the capacitive elements 116a-d may be varactors, as shown in FIG. 1. In other embodiments, one or more of the capacitive elements 116a-d may be capacitors. The capacitive load 116 may cause the output signals to oscillate at a resonance frequency of the VCO 100. A value of the resonance frequency may depend on the capacitance provided by the capacitive load 116 and the inductance provided by the passive conductive structure 104 (e.g., the first ring 108). In some embodiments, the resonance frequency may vary depending on a value of a supply voltage received by the VCO 100.

In various embodiments, VCO 100 may include a plurality of feedback structures 120a-d. The feedback structures 120a-d may be coupled between a pair of opposing taps 112a-d. For example, feedback structures 120a and 120c may be coupled between taps 112a and 112c, and feedback structures 120b and 120d may be coupled between taps 112b and 112d. In some embodiments, the feedback structures 120a-d may include one or more inverters (also referred to as feedback inverters). Feedback structures 120a-d may provide feedback between the pair of opposing taps 112a-d with gain so that output signals at the pair of opposing taps oscillate with a predetermined phase-relationship with respect to one another. For example, feedback structure 120a may provide feedback and gain to tap 112a, and may cause the first output signal at tap 112a to have the predetermined phase-relationship with respect to the third output signal at tap 112c.

The VCO may receive the supply voltage at one or more supply nodes 124a-d. In some embodiments, one or more of the feedback structures 120a-d may include the supply node 124a-d and may receive the supply voltage at the supply node 124a-d. In some embodiments, the supply voltage may be a direct current (DC) supply voltage. The feedback structures 120a-d, in conjunction with other components of VCO 100, may provide alternating current (AC) output signals at the pairs of opposing taps. In other embodiments, the supply voltage may be coupled to another component of the VCO 100, such as the current injection devices which are discussed below.

In some embodiments, the predetermined phase-relationship may be 180 degrees out-of-phase. For example, the feedback inverters of the feedback structures 120a-d may provide positive feedback and also provide output signals at the pair of opposing taps 112a-d (e.g., taps 112a and 112c or taps 112b and 112d, respectively) that are 180 degrees out-of-phase. Additionally, the pairs of opposing taps 112a-d may be oriented symmetrically around the first ring 108 so that a conductive path between the opposing pair of taps 112a-d along the first ring has the same distance in either direction (e.g., clockwise or counterclockwise). The symmetrical orientation of the taps 112a-d may further facilitate the phase-relationship between output signals at the taps 112a-d.

In some embodiments, the feedback structures 120a-d may be arranged in cross-coupled pairs of feedback inverters coupled between the respective pairs of opposing taps 112a-d. For example, the feedback inverter of feedback structure 120a may have an input terminal coupled to tap 112c and an output terminal coupled to tap 112a, and the inverter of feedback structure 120c may have an input terminal coupled to tap 112a and an output terminal coupled to tap 112c.

As shown in FIG. 1, the capacitive elements 116a-d may be coupled between pairs of opposing taps 112a-d in parallel with the respective feedback structures 120a-d. In some embodiments, the capacitive elements 116a-d may be coupled to other portions of VCO 100 and/or in a different orientation instead of or in addition to being coupled between a pair of opposing taps 112a-d. The VCO 100 may include any suitable number of capacitive elements 116a-d.

In various embodiments, VCO 100 may further include a plurality of current injection devices 128a-d coupled together in a second ring 132 that is inside the first ring 108. In some embodiments, current injection devices 128a-d may include one or more inverters (also referred to as current injection inverters). Individual current injection devices 128a-d may be coupled between a pair of adjacent taps 112a-d. For example, current injection device 128a may be coupled between tap 112a and tap 112b. Current injection device 128a may cause the first output signal and the second output signal to have a common frequency (e.g., by injection locking).

Furthermore, the current injection device 128a may cause the second output signal to have a different (e.g., shifted) phase than a phase of the first output signal. In some embodiments, the phases of the output signals may be equally spaced. Accordingly, the phase difference between the output signals at a pair of adjacent taps may be equal to 360 degrees divided by a quantity of taps in the passive conductive structure. For example, as shown in FIG. 1, VCO 100 may include four taps 112a-d and may produce four output signals, with the output signals at adjacent taps 112a-d being 90 degrees apart from one another.

In some embodiments, the spacing between the taps 112a-d on the first ring 108 of the passive conductive structure 104 may also contribute to the phase difference between adjacent taps. For example, having the taps 112a-d equally spaced on the first ring 108 may facilitate providing output signals having equally spaced phases.

Although the VCO 100 is shown in FIG. 1 with four taps 112a-d, in other embodiments the VCO 100 may include any suitable quantity of taps. In some embodiments, the quantity of taps may be an even number (e.g., 2, 4, 6, 8, etc.).

In some embodiments, the feedback structures 120a-d, current injection devices 128a-d, and/or capacitive elements 116a-d may be lumped. The term "lumped" as used herein may refer to devices that are coupled together with a characteristic length (e.g., conductive path) between devices that is at least ten times smaller than a wavelength of the signal on the conductive path. In some embodiments, a circumference of the second ring 132 may be smaller than the wavelength of the output signals, such as at least ten times smaller than the wavelength of the output signals. The lumped feedback structures 120a-d and/or current injection devices 128a-d may allow the VCO 100 to be substantially smaller than a distributed VCO, such as a traveling wave oscillator (TWO). Furthermore, the VCO 100 may be able to produce output signals having a high frequency (e.g., about 20 GHz or more).

It should be noted that the VCO 100 in FIG. 1 may not be drawn to scale. In some embodiments, the area taken up by the capacitive elements 116a-d, feedback structures 120a-d and/or current injection devices 128a-d may be substantially smaller than the area of the passive conductive structure 104.

In various embodiments, the feedback inverters may include one or more transistors (not shown), referred to herein as feedback transistors. Additionally, or alternatively, the current injection inverters may include one or more transistors (not shown), referred to herein as current injection transistors. The feedback transistors and current injection transistors may be any suitable type of transistors, such as n-type metal-oxide-semiconductor (NMOS) transistors and/or p-type metal-oxide-semiconductor (PMOS) transistors. In some embodiments all of the feedback inverters may include the same configuration of feedback transistors and all of the current injection inverters may include the same configuration of current injection transistors. In some embodiments, the feedback transistors may be of a first type (e.g., NMOS) and the current injection transistors may be of a second type (e.g., PMOS). In other embodiments, the feedback transistors and current injection transistors may be of the same type. In some embodiments, the feedback inverters and current injection inverters may include a pair of complementary transistors (e.g., an NMOS transistor and a PMOS transistor).

Figure 2:
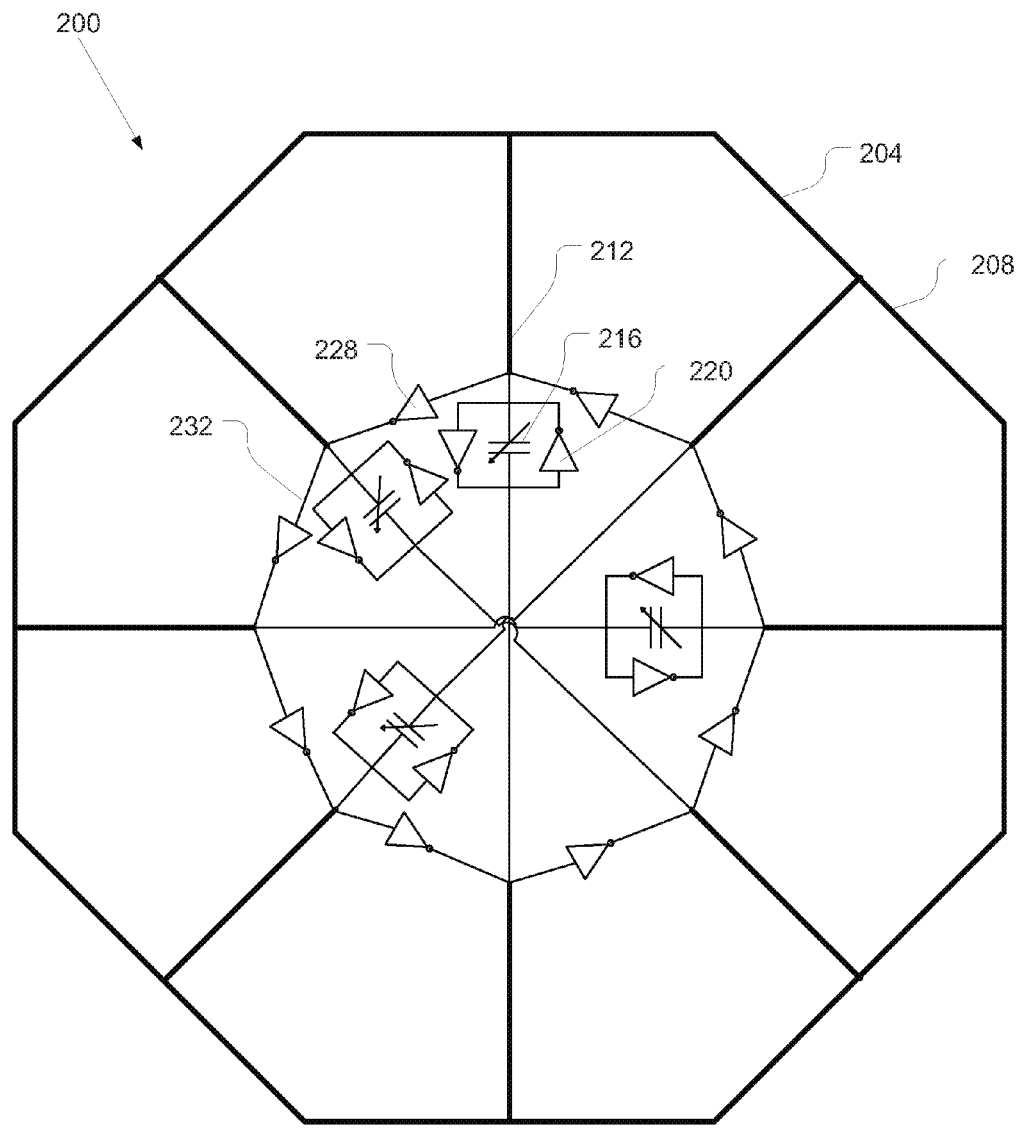
FIG. 2 is a circuit diagram of a multi-phase VCO having eight taps in accordance with various embodiments.

FIG. 2 illustrates a VCO 200 with a passive conductive structure 204 having a first ring 208. VCO 200 may be similar to VCO 100, except with eight taps 212 spaced around the first ring 308. VCO 200 may further include one or more capacitive elements 216, a plurality of feedback structures 220 and a plurality of current injection devices 228. For example, VCO may include eight feedback structures 220 and eight current injection devices 228. The feedback structures 220 may be arranged in cross-coupled pairs of inverters and may be coupled between opposing pairs of taps 212. The current injection devices 228 may be coupled in a second ring 232, with individual current injection devices 228 coupled between a pair of adjacent taps 212. VCO 200 may produce eight output signals at respective taps 212 having a common frequency and different phases. In some embodiments, the phases of the output signals may be evenly spaced with a phase difference between output signals at adjacent taps 212 of about 45 degrees.

Figure 3:
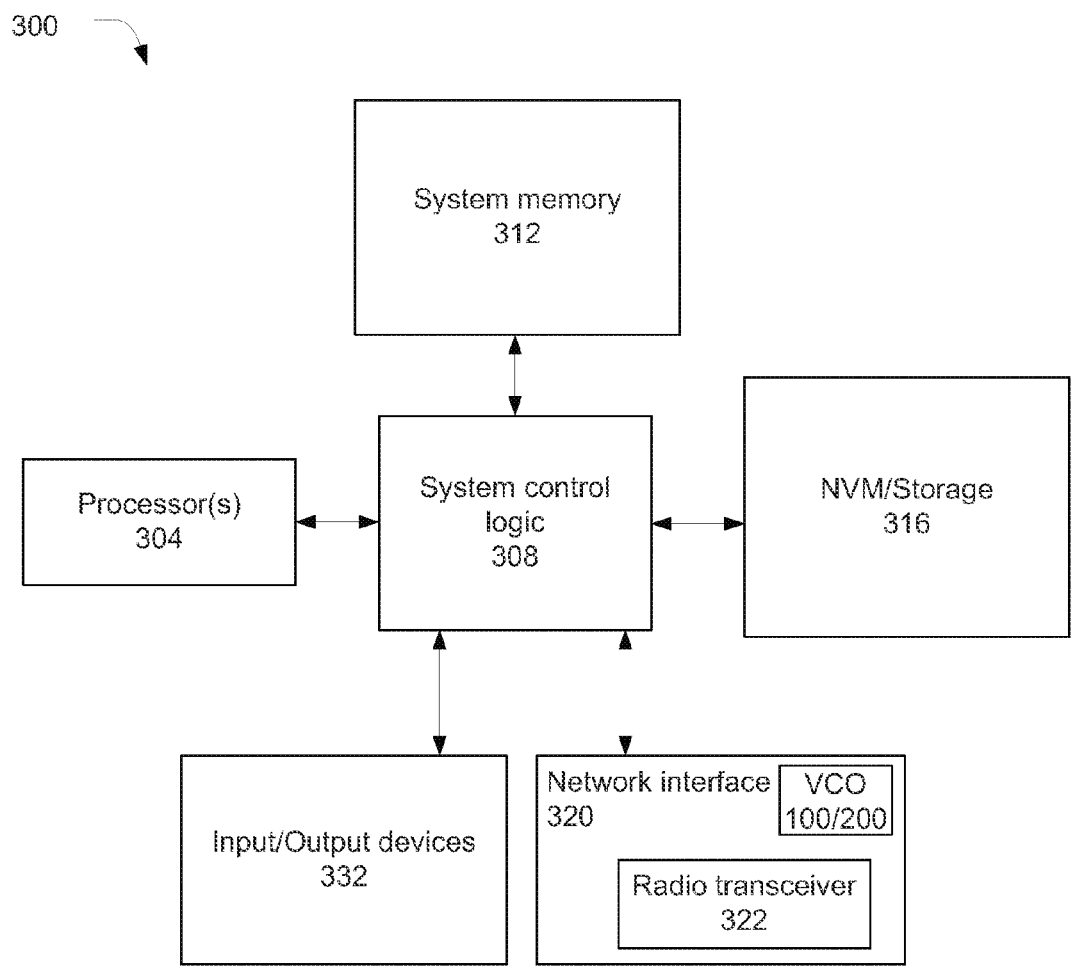
FIG. 3 is a block diagram of a wireless communications device including a multi-phase VCO in accordance with various embodiments.

The VCO 100 and/or 200 described herein may be incorporated into a variety of systems to provide multi-phase output signals. FIG. 3 illustrates, for one embodiment, an example system 300 comprising one or more processor(s) 304, system control logic 308 coupled to at least one of the processor(s) 304, system memory 312 coupled to system control logic 308, non-volatile memory (NVM)/storage 316 coupled to system control logic 308, and a network interface 320 coupled to system control logic 308. In various embodiments, the system 300 may be a wireless communication device.

The one or more processor(s) 304 may include one or more single-core or multi-core processors. The one or more processor(s) 304 may include any combination of general-purpose processors and dedicated processors (e.g., graphics processors, application processors, etc.).

System control logic 308 for one embodiment may include any suitable interface controllers to provide for any suitable interface to at least one of the processor(s) 304 and/or to any suitable device or component in communication with system control logic 308.

System control logic 308 for one embodiment may include one or more memory controller(s) to provide an interface to system memory 312. System memory 312 may be used to load and store data and/or instructions, for example, for system 300. System memory 312 for one embodiment may include any suitable volatile memory, such as suitable dynamic random access memory (DRAM), for example.

NVM/storage 316 may include one or more tangible, non-transitory computer-readable media used to store data and/or instructions, for example. NVM/storage 316 may include any suitable non-volatile memory, such as flash memory, for example, and/or may include any suitable non-volatile storage device(s), such as one or more hard disk drive(s) (HDD(s)), one or more compact disk (CD) drive(s), and/or one or more digital versatile disk (DVD) drive(s), for example.

The NVM/storage 316 may include a storage resource physically part of a device on which the system 300 is installed or it may be accessible by, but not necessarily a part of, the device. For example, the NVM/storage 316 may be accessed over a network via the network interface 320.

Network interface 320 may have a radio transceiver 322 to provide a radio interface for system 300 to communicate over one or more network(s) and/or with any other suitable device. Network interface 320 may include any suitable hardware and/or firmware. Network interface 320 may include one or more antennas. For example, network interface 320 may include a plurality of antennas to provide a MIMO radio interface. Network interface 320 for one embodiment may include, for example, a network adapter, a wireless network adapter, a telephone modem, and/or a wireless modem.

In some embodiments, the transceiver 322 may be configured to transmit and/or receive data signals over a wireless communications network. The data signals may be transmitted and/or received with a carrier frequency. In other embodiments, the transceiver 322 may send the data signals over a wireline network and/or another communications interface.

In various embodiments, the VCO 100 and/or 200 may be coupled to the transceiver 322 to facilitate the transceiver 322 to send and/or receive the data signals. The VCO 100 may provide the transceiver 322 with a plurality of output signals having a common frequency and different phases. In some embodiments, the phases of the output signals may be evenly spaced. The resonant frequency of the VCO 100 may be adjusted (e.g., by controlling the value of the supply voltage) to produce output signals having a frequency equal to the carrier frequency. The transceiver 322 may use the output signals of the VCO 100 to transmit the data signals over the wireless communication network.

In some embodiments, the transceiver 322 may transmit and/or receive data signals using quadrature modulation, such as I/Q modulation and/or quadrature amplitude modulation (QAM). The output signals of the VCO 100 may be used to produce and/or decode different phase components of the I/Q signal. For example, the VCO 100 may produce four output signals (e.g., carrier signals) having equally spaced phases: a pair of sine waves that are 180 degrees out-of-phase with respect to one another, and a pair of cosine waves that are 180 degrees out-of-phase with respect to one another.

In some embodiments, the system 300 may be used in wireless communication networks that employ orthogonal frequency division multiple access (OFDMA) communications as used by multicarrier transmission schemes presented in, e.g., the Institute of Electrical and Electronics Engineers (IEEE) 802.16-2009, approved May 13, 2009, along with any amendments, updates, and/or revisions, 3rd Generation Partnership Project (3GPP) long-term evolution (LTE) project, advanced LTE project, ultra mobile broadband (UMB) project (also referred to as "3GPP2"), etc. In other embodiments, communications may be compatible with additional/alternative communication standards and/or specifications.

For one embodiment, at least one of the processor(s) 304 may be packaged together with logic for one or more controller(s) of system control logic 308. For one embodiment, at least one of the processor(s) 304 may be packaged together with logic for one or more controllers of system control logic 308 to form a System in Package (SiP). For one embodiment, at least one of the processor(s) 304 may be integrated on the same die with logic for one or more controller(s) of system control logic 308. For one embodiment, at least one of the processor(s) 304 may be integrated on the same die with logic for one or more controller(s) of system control logic 308 to form a System on Chip (SoC).

The system 300 may further include input/output (I/O) devices 332. The I/O devices 332 may include user interfaces designed to enable user interaction with the system 300, peripheral component interfaces designed to enable peripheral component interaction with the system 300, and/or sensors designed to determine environmental conditions and/or location information related to the system 300.

In various embodiments, the user interfaces could include, but are not limited to, a display (e.g., a liquid crystal display, a touch screen display, etc.), a speaker, a microphone, one or more cameras (e.g., a still camera and/or a video camera), a flashlight (e.g., a light emitting diode flash), and a keyboard.

In various embodiments, the peripheral component interfaces may include, but are not limited to, a non-volatile memory port, an audio jack, and a power supply interface.

In various embodiments, the sensors may include, but are not limited to, a gyro sensor, an accelerometer, a proximity sensor, an ambient light sensor, and a positioning unit. The positioning unit may also be part of, or interact with, the network interface 320 to communicate with components of a positioning network, e.g., a global positioning system (GPS) satellite.

In various embodiments, the system 300 may be a mobile computing device such as, but not limited to, a laptop computing device, a tablet computing device, a netbook, a smartphone, etc. Additionally, or alternatively, the system 300 may be a desktop computing device (e.g., a personal computer), a set-top box, and/or a wireless base station (e.g., an evolved NodeB (eNodeB), access point (AP), etc.). In various embodiments, system 300 may have more or less components, and/or different architectures.

In further embodiments, VCO 100 and/or VCO 200 may be incorporated into other devices and/or for other purposes, such as to facilitate wireline communications between devices, and/or to facilitate communications between different components of the same device.

Although certain example methods, apparatus, and articles of manufacture have been described herein, the scope of coverage of the present disclosure is not limited thereto. On the contrary, the present disclosure covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware.

What is claimed is:

1. A voltage controlled oscillator (VCO) comprising:
a passive conductive structure having a first ring and a plurality of taps spaced around the first ring;
a capacitive load coupled to the passive conductive structure;
a plurality of feedback structures, wherein one or more feedback structures of the plurality of feedback structures are coupled between a pair of opposing taps of the plurality of taps, the one or more feedback structures configured to provide positive feedback between the pair of opposing taps with gain so that output signals at the pair of opposing taps oscillate with a predetermined phase-relationship with respect to one another; and
a plurality of current injection devices coupled together in a second ring, a first current injection device of the plurality of current injection devices coupled between a pair of adjacent taps of the plurality of taps and configured to provide output signals at the pair of adjacent taps with a common frequency;
wherein the plurality of current injection devices include a plurality of inverters arranged in the second ring, an output terminal of a first inverter of the plurality of inverters coupled to an input terminal of a second inverter of the plurality of inverters in the second ring, the first and second inverters being coupled in series with one another.

2. The VCO of claim 1, wherein the predetermined phase-relationship is 180 degrees out-of-phase.

3. The VCO of claim 1, wherein the first current injection device is further configured to provide the output signals at the pair of adjacent taps with different phases.

4. The VCO of claim 1, wherein the one or more feedback structures include a pair of cross-coupled inverters.

5. The VCO of claim 4, wherein the one or more feedback structures include a supply node configured to receive a supply voltage, the supply voltage being a direct current (DC) voltage.

6. The VCO of claim 1, wherein the plurality of feedback structures and the plurality of current injection devices are lumped.

7. The VCO of claim 1, wherein the capacitive load includes a varactor.

8. The VCO of claim 1, wherein the varactor is coupled between the pair of opposing taps.

9. The VCO of claim 1, wherein the passive conductive structure comprises a metal.

10. The VCO of claim 1, wherein a quantity of taps is an even number.

11. The VCO of claim 10, wherein the quantity of taps is equal to four.

12. The VCO of claim 1, wherein the plurality of taps are evenly spaced around the first ring of the passive conductive structure, and wherein phases of output signals from individual taps of the plurality of taps are evenly spaced.

13. A circuit, comprising:
a passive conductive structure having a first ring and a plurality of taps spaced around the first ring;
a pair of feedback inverters coupled between a pair of opposing taps located across the first ring from one another, an input terminal of a first inverter of the pair of feedback inverters coupled to an output terminal of a second inverter of the pair of feedback inverters at a first tap of the pair of opposing taps, and an output terminal of the first inverter coupled to an input terminal of the second inverter at a second tap of the pair of opposing taps;
a plurality of current injection inverters coupled together in a second ring, individual current injection inverters of the plurality of current injection inverters coupled between adjacent taps of the plurality of taps; and a plurality of capacitive elements, one or more of the plurality of capacitive elements coupled between the pair of opposing taps;

wherein the individual feedback inverters of the plurality of feedback inverters include one or more feedback transistors of a first type, and the individual current injection inverters include one or more current injection transistors of a second type, the second type being different from the first type.

14. The circuit of claim 13, wherein the pair of feedback inverters are configured to receive a direct current (DC) supply voltage and to provide feedback and gain to the opposing taps to provide alternating current (AC) output signals at the pair of opposing taps having a predetermined phase-relationship with respect to one another.

15. The circuit of claim 14, wherein the predetermined phase-relationship is 180 degrees out-of-phase.

16. The circuit of claim 14, wherein the plurality of taps are evenly spaced around the first ring of the passive conductive structure, and a phase difference between output signals at a pair of adjacent taps of the plurality of taps is equal to 360 degrees divided by a quantity of taps in the passive conductive structure.

17. The circuit of claim 13, wherein individual feedback transistors include a pair of complementary transistors.

18. The circuit of claim 13, wherein the plurality of feedback inverters and the plurality of current injection inverters are lumped.

19. The circuit of claim 13, wherein the passive conductive structure includes four or eight taps.

20. A system comprising:
a transceiver;
a voltage controlled oscillator (VCO) coupled to the transceiver and configured to provide the transceiver with a plurality of output signals having the same frequency and different equally spaced phases, the VCO including:
a passive metal structure having a first ring and a plurality of taps equally spaced around the first ring;
a plurality of feedback structures, wherein one or more feedback structures of the plurality of feedback structures are coupled between a pair of opposing taps, the one or more feedback structures configured to provide positive feedback to the pair of opposing taps with gain so that output signals at the pair of opposing taps oscillate with a predetermined phase-relationship with respect to one another;
one or more varactors coupled between the pair of opposing taps of the plurality of taps; and
a plurality of current injection devices coupled together in a second ring, a first current injection device of the plurality of current injection devices coupled between a pair of adjacent taps of the plurality of taps and configured to provide output signals at the pair of adjacent taps with a common frequency and different phases;
wherein the plurality of current injection devices include a plurality of inverters arranged in the second ring, an output terminal of a first inverter of the plurality of inverters coupled to an input terminal of a second inverter of the plurality of inverters in the second ring, the first and second inverters being adjacent to one another.

21. The system of claim 20, wherein the transceiver is configured to transmit and/or receive data signals using quadrature modulation.

22. The VCO of claim 20, wherein the one or more feedback structures include a pair of cross-coupled inverters.

23. The VCO of claim 20, wherein the one or more feedback structures include a supply node configured to receive a supply voltage, the supply voltage being a direct current (DC) voltage.

24. The system of claim 20, wherein the plurality of feedback structures and the plurality of current injection devices are lumped.

* * * * *